United States Patent
Tanimoto et al.

(10) Patent No.: US 12,116,675 B2
(45) Date of Patent: Oct. 15, 2024

(54) ADHESION REMOVAL METHOD AND FILM-FORMING METHOD

(71) Applicant: SHOWA DENKO K.K., Tokyo (JP)

(72) Inventors: Yosuke Tanimoto, Tokyo (JP); Shimon Osada, Tokyo (JP)

(73) Assignee: Resonac Corporation, Tokyo (JP)

( * ) Notice: Subject to any disclaimer, the term of this patent is extended or adjusted under 35 U.S.C. 154(b) by 471 days.

(21) Appl. No.: 17/418,344

(22) PCT Filed: Dec. 10, 2019

(86) PCT No.: PCT/JP2019/048351
§ 371 (c)(1),
(2) Date: Jun. 25, 2021

(87) PCT Pub. No.: WO2020/137527
PCT Pub. Date: Jul. 2, 2020

(65) Prior Publication Data
US 2022/0064788 A1 Mar. 3, 2022

(30) Foreign Application Priority Data
Dec. 25, 2018 (JP) .................. 2018-240515

(51) Int. Cl.
*C23C 8/08* (2006.01)
*H01L 21/02* (2006.01)

(52) U.S. Cl.
CPC .......... *C23C 8/08* (2013.01); *H01L 21/02334* (2013.01)

(58) Field of Classification Search
None
See application file for complete search history.

(56) References Cited

U.S. PATENT DOCUMENTS

| 4,622,210 A | 11/1986 | Hirschberg et al. |
| 2008/0230510 A1 | 9/2008 | Appleyard et al. |
| 2012/0015525 A1 | 1/2012 | Endo et al. |
| 2013/0095601 A1 | 4/2013 | Beck |
| 2015/0170914 A1 | 6/2015 | Haukka et al. |
| 2017/0073812 A1 | 3/2017 | Sundaram |

FOREIGN PATENT DOCUMENTS

| JP | 61-064317 A | 4/1986 |
| JP | 2009-503882 A | 1/2009 |
| JP | 2011-189338 A | 9/2011 |

(Continued)

OTHER PUBLICATIONS

Written opinion for PCT/JP2019/048351 dated Mar. 3, 2020, 5 Pages.

(Continued)

*Primary Examiner* — Eric W Golightly
*Assistant Examiner* — Arlyn I Rivera-Cordero
(74) *Attorney, Agent, or Firm* — Sughrue Mion, PLLC

(57) ABSTRACT

Provided are an adhesion removal method capable of removing sulfur-containing adhesions that adhere onto the inner surface of a chamber or the inner surface of a pipe connected to the chamber without disassembly of the chamber and a film-forming method. Sulfur-containing adhesions adhering onto at least one of the inner surface of a chamber (10) and the inner surface of a discharge pipe (15) connected to the chamber (10) are removed by reaction with a cleaning gas containing an oxygen-containing compound gas.

11 Claims, 1 Drawing Sheet

(56) References Cited

FOREIGN PATENT DOCUMENTS

| | | |
|---|---|---|
| JP | 2012-039084 A | 2/2012 |
| JP | 2016-207789 A | 12/2016 |
| JP | 2017-61743 A | 3/2017 |
| JP | 2018-188339 A | 11/2018 |
| WO | 2016/170988 A1 | 10/2016 |

OTHER PUBLICATIONS

International search report for PCT/JP2019/048351 dated Mar. 3, 2020, 2 Pages.
International Preliminary Report on Patentability with translation of Written Opinion dated Jun. 16, 2021, in International Application No. PCT/JP2019/048351, 7 Pages.
Extended European Search Report dated Feb. 11, 2022 in European Application No. 19901782.3, 6 Pages.

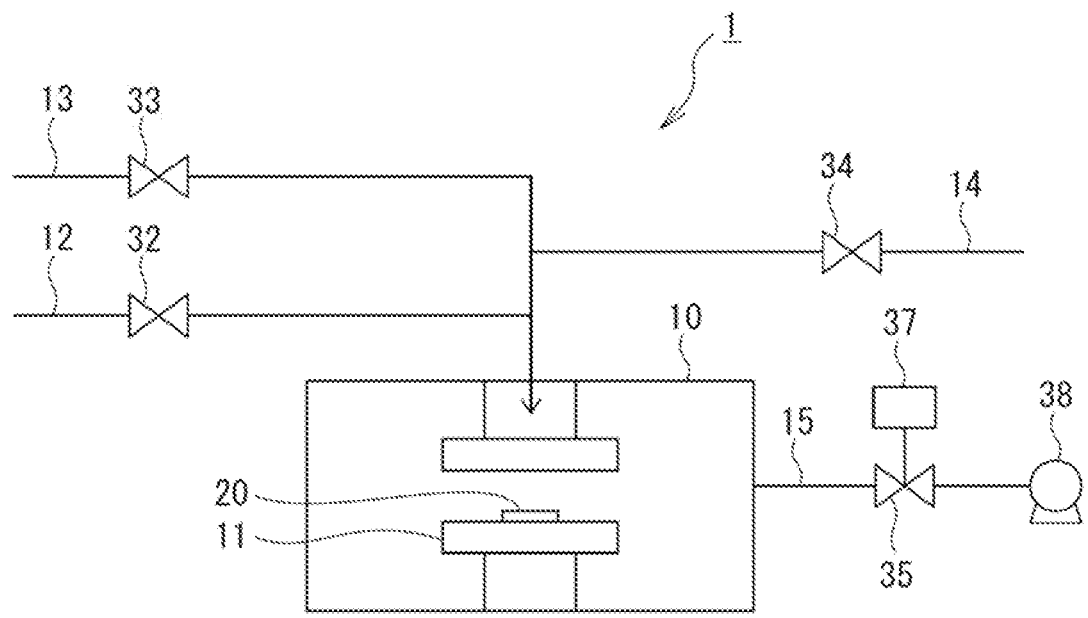

ADHESION REMOVAL METHOD AND FILM-FORMING METHOD

CROSS-REFERENCE TO RELATED APPLICATIONS

This application is a National Stage of International Application No. PCT/JP2019/048351 filed Dec. 10, 2019, which claims priority under U.S.C. § 119(a) to Japanese Patent Application No. 2018-240515 filed on Dec. 25, 2018.

TECHNICAL FIELD

The present invention relates to an adhesion removal method and a film-forming method.

BACKGROUND ART

In a recent semiconductor field, a semiconductor material containing an element other than silicon (Si) has been drawing attention. Examples of the semiconductor material containing an element other than silicon include semiconductor materials containing Group III-V elements such as germanium (Ge) and indium/gallium/arsenic (InGaAs) and semiconductor materials containing metal chalcogenides.

These semiconductor materials advantageously have higher mobility than silicon materials but may be difficult to form a film or may give a high defect density of the interface between materials.

To reduce the defect density of the interface between materials, a method of using hydrogen sulfide ($H_2S$) gas to form a passivation film on a substrate of germanium, molybdenum, or the like is disclosed (for example, see PTL 1). As a method for forming a film of a metal chalcogenide, a method of treating a molybdenum oxide layer or a tungsten oxide layer with hydrogen sulfide gas to form a molybdenum sulfide layer or a tungsten sulfide layer is disclosed (for example, see PTL 2).

CITATION LIST

Patent Literature

PTL 1: JP 2016-207789 A
PTL 2: JP 2017-61743 A
PTL 3: JP 2011-189338 A

SUMMARY OF INVENTION

Technical Problem

In the above method that reduces the defect density of the interface between materials, the reaction is performed at a high temperature, and thus sulfur-containing adhesions formed by decomposition of hydrogen sulfide may adhere onto the inner surface of a chamber in which the reaction is performed or onto the inner surface of a pipe provided downstream of the chamber.

If a substrate such as a wafer were introduced into a chamber in a condition where sulfur-containing adhesions adhered onto the inner surface of the chamber or the inner surface of a pipe provided downstream of the chamber, and the chamber were evacuated and replaced with an inert gas, sulfur particles might adhere onto the substrate such as a wafer. If the sulfur particles adhered onto the substrate, a produced semiconductor structure might have poor performance.

For example, PTL 3 discloses a technology of cleaning a substrate by using a plasma cleaning apparatus. In the technology, sulfur derived from sulfur hexafluoride gas used for the cleaning of a substrate adheres onto the substrate, and thus the adhering sulfur is removed by argon sputtering.

However, in the technology disclosed in PTL 3, sulfur is physically removed, and thus the removed sulfur re-adheres onto a different place in the plasma cleaning apparatus or re-adheres onto a pipe provided downstream of the plasma cleaning apparatus, unfortunately.

Hence, when sulfur-containing adhesions adhere onto the inner surface of a chamber or the inner surface of a pipe provided downstream of the chamber, the chamber is required to be disassembled for cleaning.

The present invention is intended to provide an adhesion removal method capable of removing sulfur-containing adhesions that adhere onto the inner surface of a chamber or the inner surface of a pipe connected to the chamber without disassembly of the chamber and to provide a film-forming method.

Solution to Problem

To solve the problems, aspects of the present invention are the following [1] to [6].

[1] An adhesion removal method including reacting a sulfur-containing adhesion with a cleaning gas containing an oxygen-containing compound gas, the sulfur-containing adhesion adhering onto at least one of an inner surface of a chamber and an inner surface of a pipe connected to the chamber, thereby removing the sulfur-containing adhesion.

[2] The adhesion removal method according to the aspect [1], in which the cleaning gas is brought into contact with the adhesion in a condition of a temperature of 20° C. or more and 800° C. or less and a pressure of 20 Pa or more and 101 kPa or less.

[3] The adhesion removal method according to the aspect [1] or [2], in which the oxygen-containing compound gas is at least one selected from the group consisting of oxygen gas, nitrogen monoxide, nitrous oxide, and carbon monoxide.

[4] The adhesion removal method according to the aspect [1] or [2], in which the oxygen-containing compound gas is oxygen gas.

[5] A film-forming method including a passivation step of supplying a passivation gas containing a sulfur-containing compound gas to a chamber in which a substrate is stored and reacting the substrate with the passivation gas to form a passivation film on a surface of the substrate, and
　after the passivation step, an adhesion removal step of removing a sulfur-containing adhesion adhering onto at least one of an inner surface of the chamber and an inner surface of a pipe connected to the chamber, in which
　the adhesion removal step is performed by the adhesion removal method according to any one of the aspects [1] to [4].

[6] The film-forming method according to the aspect [5], in which the sulfur-containing compound gas is hydrogen sulfide gas.

Advantageous Effects of Invention

According to the present invention, sulfur-containing adhesions adhering onto the inner surface of a chamber or the inner surface of a pipe connected to the chamber can be removed without disassembly of the chamber.

BRIEF DESCRIPTION OF DRAWINGS

The FIGURE is a schematic view of a film formation apparatus illustrating an embodiment of a film-forming method pertaining to the present invention.

DESCRIPTION OF EMBODIMENTS

Embodiments of the present invention will now be described. The embodiments are merely examples of the present invention, and the present invention is not limited to the embodiments. Various modifications or improvements can be made in the embodiments, and such modifications and improvements can be encompassed by the present invention.

First Embodiment

A first embodiment of the present invention is an embodiment of an adhesion removal method and is a method for removing sulfur-containing adhesions (hereinafter also simply called "adhesions") adhering onto at least one of the inner surface of a chamber and the inner surface of a pipe connected to the chamber by reaction with a cleaning gas containing an oxygen-containing compound gas. Neither the oxygen-containing compound gas nor the cleaning gas contains sulfur atoms.

For example, when a reaction using sulfur is performed in a chamber, sulfur-containing adhesions may adhere onto the inner surface of the chamber or the inner surface of a pipe connected to the chamber (for example, a cleaning gas supply pipe connected upstream of the chamber, or a discharge pipe connected downstream of the chamber). If a subsequent reaction were performed while adhesions adhered, the reaction might be adversely affected. Hence, the subsequent reaction is preferably performed after removal of the adhesions.

In the adhesion removal method pertaining to the first embodiment, a cleaning gas is brought into contact with adhesions, thus sulfur in the adhesions is reacted with an oxygen-containing compound gas in the cleaning gas to form a sulfur oxide gas such as sulfur dioxide, and accordingly the adhesions are removed. Hence, the adhesions adhering onto the inner surface of a chamber or the inner surface of a pipe connected to the chamber can be removed without disassembly of the chamber. Therefore, the adhesions can be easily removed.

The contact of the cleaning gas with the adhesions is preferably performed in a condition of a temperature of 20° C. or more and 800° C. or less and more preferably performed in a condition of a temperature of 40° C. or more and 600° C. or less. At a temperature of 800° C. or less, an oxygen-containing compound gas in the cleaning gas or a formed sulfur oxide gas is unlikely to corrode a metal material such as stainless steel that forms a chamber or a pipe, and the sulfur oxide gas that has been formed by the reaction between sulfur in the adhesions and an oxygen-containing compound gas in the cleaning gas is unlikely to undergo a reverse reaction into sulfur. At a temperature of 20° C. or more, the reaction between sulfur in the adhesions and an oxygen-containing compound gas in the cleaning gas is facilitated.

The contact of the cleaning gas with the adhesions is preferably performed in a condition of a pressure of 20 Pa or more and 101 kPa or less in terms of absolute pressure and more preferably performed in a condition of a pressure of 60 Pa or more and 90 kPa or less. At a pressure of 101 kPa or less, the chamber or the pipe is unlikely to cause problems. For example, when the chamber is a reaction container of a film formation apparatus in which a substrate is reacted with a passivation gas to form a passivation film on the surface of the substrate, the chamber is used in a reduced pressure environment, and thus the pressure condition is preferably 101 kPa or less. At a pressure of 20 Pa or more, the reaction between sulfur in the adhesions and an oxygen-containing compound gas in the cleaning gas is facilitated.

The oxygen-containing compound gas is a gas of a compound having oxygen atoms and is a gas having no sulfur atoms or halogen atoms, and examples include oxygen gas, a nitrogen oxide gas, and a carbon oxide gas. Of them, at least one gas selected from the group consisting of oxygen gas ($O_2$), nitrogen monoxide (NO), nitrous oxide ($N_2O$), and carbon monoxide (CO) is preferred, and at least one of oxygen gas and carbon monoxide is more preferred.

At a pressure of 101 kPa, oxygen gas is reacted with sulfur at a temperature of 190° C. or more, and thus when the cleaning gas contains oxygen gas, the cleaning gas is preferably brought into contact with sulfur (adhesions) at a temperature of 190° C. or more and 800° C. or less. When the cleaning gas contains oxygen gas, adhesions are preferably removed while the inside of the chamber or the pipe is heated in order to efficiently remove the adhesions. At a pressure of 101 kPa, carbon monoxide is reacted with sulfur at a temperature of 300° C. or more, and thus when the cleaning gas contains carbon monoxide, the cleaning gas is preferably brought into contact with sulfur (adhesions) at a temperature of 300° C. or more and 800° C. or less.

In the cleaning gas, the content of the oxygen-containing compound gas may be any value that is sufficient to remove sulfur (adhesions), and is preferably 5% by volume or more, more preferably 20% by volume or more, even more preferably 90% by volume or more, and particularly preferably 100% by volume. Components other than the oxygen-containing compound gas contained in the cleaning gas may be any gas of a compound that has no sulfur atoms, and examples include an inert gas such as nitrogen gas and argon gas.

The chamber may be formed from any material that resists hydrogen sulfide, and preferably has a structure capable of being decompressed to a predetermined pressure, and examples of the material include an aluminum having an anodized surface. The pipe connected to the chamber may also be formed from any material that resists hydrogen sulfide, and preferably has a structure capable of withstanding a predetermined pressure. The adhesion removal method pertaining to the first embodiment can be suitably applied, for example, to a chamber included as the reaction container in a semiconductor film formation apparatus and to a pipe connected to the chamber.

Second Embodiment

A second embodiment of the present invention is an embodiment of a film-forming method and is a method including a passivation step of supplying a passivation gas containing a sulfur-containing compound gas to a chamber in which a substrate is stored and reacting the substrate with the passivation gas to form a passivation film on the surface of the substrate and including, after the passivation step, an adhesion removal step of removing sulfur-containing adhesions that adhere onto at least one of the inner surface of the chamber and the inner surface of a pipe connected to the chamber. In the method, the adhesion removal step is performed by the adhesion removal method of the first embodiment.

In the passivation step to form a passivation film on the surface of a substrate by using a passivation gas, sulfur-containing adhesions may adhere onto the inner surface of the chamber or the inner surface of a pipe connected to the chamber (for example, a passivation gas or cleaning gas supply pipe connected upstream of the chamber, or a discharge pipe connected downstream of the chamber).

If a substrate were introduced into a chamber in a condition where adhesions adhered onto the inner surface of the chamber or the inner surface of a pipe, and the chamber were evacuated and replaced with an inert gas, sulfur particles might adhere onto the substrate. If the sulfur particles adhered onto the substrate, a produced semiconductor structure might have poor performance. If the subsequent passivation step were performed while sulfur particles adhered onto the substrate, the formation speed of the passivation film or the film quality might deteriorate, unfortunately. Hence, the adhesions are preferably removed before the subsequent passivation step.

In the film-forming method pertaining to the second embodiment, a cleaning gas is brought into contact with adhesions, thus sulfur in the adhesions is reacted with an oxygen-containing compound gas in the cleaning gas to form a sulfur oxide gas, and accordingly the adhesions are removed. Hence, the adhesions adhering onto the inner surface of a chamber or the inner surface of a pipe connected to the chamber can be removed without disassembly of the chamber. Therefore, the adhesions can be easily removed. By the film-forming method pertaining to the second embodiment, sulfur particles can be prevented from adhering onto a substrate by removal of adhesions, and thus a semiconductor structure having excellent properties can be produced.

In the film-forming method pertaining to the second embodiment, the adhesion removal step is not necessarily performed after every passivation step, and the adhesion removal step may be performed after the passivation step is performed twice or more. By reducing the number of times of the adhesion removal step relative to the number of times of the passivation step, the utilization efficiency of a film formation apparatus can be improved.

The type of the passivation gas containing a sulfur-containing compound gas may be any gas of a compound that has sulfur, and is preferably hydrogen sulfide gas, which has good passivation performance.

In the passivation gas, the content of the sulfur-containing compound gas may be any value that is sufficient to form a passivation film, and is preferably 1% by volume or more, more preferably 2% by volume or more, even more preferably 10% by volume or more, and particularly preferably 100% by volume. Components other than the sulfur-containing compound gas contained in the passivation gas may be any gas, and examples include an inert gas such as nitrogen gas and argon gas.

The type of the material forming the substrate may be any semiconductor material, and examples include materials containing an element such as silicon, germanium, Group III-V compounds, molybdenum, and tungsten. The silicon is preferably a silicon used to form a semiconductor device, and examples include amorphous silicon, polysilicon, and single crystalline silicon. The germanium, the Group III-V compounds, the molybdenum, and the tungsten are also preferably materials used to form a semiconductor device.

In the passivation step, the pressure in the chamber when a passivation film is formed may be any value and is preferably 1 Pa or more and 101 kPa or less, more preferably 10 Pa or more and 90 kPa or less, and particularly preferably 100 Pa or more and 80 kPa or less.

In the passivation step, the temperature of a substrate when the substrate is reacted with the passivation gas may be any value. In order to achieve high in-plane uniformity of a substrate surface treated with the passivation gas, the temperature is preferably 20° C. or more and 1,500° C. or less, more preferably 50° C. or more and 1,200° C. or less, and particularly preferably 100° C. or more and 1,000° C. or less.

In the passivation step, the passivation time may be any value and is preferably within 120 minutes in consideration of efficiency of a semiconductor device production process. The passivation time is a time from supply of a passivation gas into a chamber in which a substrate is stored to discharge of the passivation gas in the chamber by a vacuum pump or the like to finish the treatment of the substrate surface with the passivation gas.

The film-forming method pertaining to the second embodiment can be suitably applied to a semiconductor film formation apparatus in which a passivation film is formed on the surface of a substrate. The film formation apparatus may have any structure, and the positional relation between a substrate stored in a chamber as the reaction container and a pipe connected to the chamber is not particularly limited.

EXAMPLES

The present invention will next be described in further detail with reference to examples and comparative examples.

Example 1

A film formation apparatus 1 illustrated in the FIGURE was used to repeatedly perform a passivation step of forming a passivation film on the surface of a substrate and an adhesion removal step of removing sulfur-containing adhesions. The film formation apparatus 1 included a chamber 10 in which the passivation step and the adhesion removal step were performed and a temperature controller (not illustrated) for controlling the temperature in the chamber 10. In the chamber 10, a stage 11 for supporting a sample 20 was provided. The sample 20 used was a silicon substrate on which a silicone oxide film having a thickness of 150 nm was formed and a germanium film having a thickness of 80 nm was formed on the silicone oxide film.

Upstream of the chamber 10, a passivation gas supply pipe 12 for supplying a passivation gas containing a sulfur-containing compound gas to the chamber 10, a cleaning gas supply pipe 13 for supplying a cleaning gas containing an oxygen-containing compound gas to the chamber 10, and an inert gas supply pipe 14 for supplying an inert gas to the chamber 10 were connected through valves 32, 33, 34, respectively.

Downstream of the chamber 10, a discharge pipe 15 for discharging a gas in the chamber 10 to the outside was connected, and downstream of the discharge pipe 15, a vacuum pump 38 was connected through a valve 35. The pressure in the chamber 10 was controlled by a pressure controller 37 for controlling the valve 35.

Such a film formation apparatus 1 was used to perform the passivation step, first. On the stage 11, a sample 20 was placed, then the pressure in the chamber 10 was decompressed to less than 10 Pa, and the temperature in the chamber 10 was raised to 800° C. The valve 32 was then opened, and hydrogen sulfide gas as the passivation gas was supplied at a pressure of 101 kPa through the passivation gas supply pipe 12 into the chamber 10. During the supply, the flow rate of the passivation gas was set at 100 sccm, and during the formation of a passivation film on the surface of the sample 20, the pressure in the chamber 10 was set at 67 kPa. In the description, sccm represents a flow rate (mL/min) at 0° C. and 101.3 kPa.

By the introduction of the passivation gas for 30 minutes, the surface of the sample 20 was sulfurized in a condition of a temperature of 800° C. and a pressure of 67 kPa to form a passivation film, and then the introduction of the passivation gas was stopped. The inside of the chamber 10 was next evacuated by the vacuum pump 38, then an inert gas was supplied through the inert gas supply pipe 14 into the chamber 10, and the inside of the chamber 10 was replaced with the inert gas. The temperature in the chamber 10 was then lowered to room temperature, and the sample 20 with the passivation film was taken out from the chamber 10.

Next, the film formation apparatus 1 was used to perform the adhesion removal step. The pressure in the chamber 10 from which the sample 20 had been taken out was lowered to less than 10 Pa, and then the temperature in the chamber 10 was raised to 500° C. The valve 33 was next opened, and oxygen gas as the cleaning gas was supplied through the cleaning gas supply pipe 13 into the chamber 10 and the discharge pipe 15. During the supply, the flow rate of the cleaning gas was set at 100 sccm, and during the removal of adhesions, the pressure in the chamber 10 was set at 67 kPa.

By the introduction of the cleaning gas for 5 minutes, adhesions were reacted with oxygen gas in a condition of a temperature of 500° C. and a pressure of 67 kPa, accordingly the adhesions were removed, and the introduction of the cleaning gas was stopped. The inside of the chamber 10 was next evacuated by the vacuum pump 38, then an inert gas was supplied through the inert gas supply pipe 14 into the chamber 10, and the inside of the chamber 10 was replaced with the inert gas.

After the completion of the adhesion removal step, the passivation step was performed in a similar manner to the above, and a passivation film was formed on a fresh sample 20. The adhesion removal step was then performed in a similar manner to the above. Such operations were repeated, and 100 pieces of samples 20 in total each having a passivation film were produced.

Example 2

The same procedure as in Example 1 was performed except that, in the adhesion removal step, the temperature in the chamber 10 was set at 350° C. and the pressure was set at 100 Pa, giving 100 pieces of samples 20 each having a passivation film.

Example 3

The same procedure as in Example 1 was performed except that, in the adhesion removal step, the temperature in the chamber 10 was set at 20° C., giving 100 pieces of samples 20 each having a passivation film.

Example 4

The same procedure as in Example 1 was performed except that, in the adhesion removal step, the temperature in the chamber 10 was set at 800° C., giving 100 pieces of samples 20 each having a passivation film.

Example 5

The same procedure as in Example 1 was performed except that, in the adhesion removal step, the pressure in the chamber 10 was set at 20 Pa, giving 100 pieces of samples 20 each having a passivation film.

Example 6

The same procedure as in Example 1 was performed except that, in the adhesion removal step, the pressure in the chamber 10 was set at 101 kPa, giving 100 pieces of samples 20 each having a passivation film.

Example 7

The same procedure as in Example 1 was performed except that, in the adhesion removal step, carbon monoxide was supplied as the cleaning gas through the cleaning gas supply pipe 13, giving 100 pieces of samples 20 each having a passivation film.

Comparative Example 1

The same procedure as in Example 1 was performed except that no adhesion removal step was performed but only the passivation step was repeatedly performed, giving 100 pieces of samples 20 each having a passivation film.

After every passivation step for first to 100th samples 20 in each of Examples 1 to 7 and Comparative Example 1, the number of sulfur particles adhering onto the surface of each sample 20 was counted. The number of particles was counted by using a wafer tester, Surfscan (registered trademark) 6240 manufactured by KLA-Tencor. The measurement result is presented in Table 1.

TABLE 1

| | Temperature (° C.) | Pressure (Pa) | Cleaning gas type | The number of particles (particles/m$^2$) | | | | | | | | |
|---|---|---|---|---|---|---|---|---|---|---|---|---|
| | | | | The number of times of passivation step (times) | | | | | | | | |
| | | | | 1 | 10 | 20 | 30 | 40 | 50 | 60 | 80 | 100 |
| Example 1 | 500 | 67000 | O$_2$ | 86 | 89 | 85 | 83 | 85 | 79 | 92 | 80 | 86 |
| Example 2 | 350 | 100 | O$_2$ | 93 | 131 | 160 | 173 | 183 | 201 | 238 | 255 | 291 |
| Example 3 | 20 | 67000 | O$_2$ | 97 | 128 | 258 | 326 | 472 | 539 | 589 | 769 | 981 |
| Example 4 | 800 | 67000 | O$_2$ | 85 | 91 | 93 | 89 | 84 | 98 | 82 | 79 | 91 |

TABLE 1-continued

|  | Temperature (° C.) | Pressure (Pa) | Cleaning gas type | The number of particles (particles/m$^2$) The number of times of passivation step (times) | | | | | | | | |
|---|---|---|---|---|---|---|---|---|---|---|---|---|
|  |  |  |  | 1 | 10 | 20 | 30 | 40 | 50 | 60 | 80 | 100 |
| Example 5 | 500 | 20 | O$_2$ | 85 | 118 | 132 | 152 | 207 | 297 | 361 | 508 | 639 |
| Example 6 | 500 | 101000 | O$_2$ | 88 | 79 | 92 | 95 | 82 | 89 | 77 | 91 | 92 |
| Example 7 | 500 | 67000 | CO | 79 | 82 | 83 | 91 | 98 | 84 | 79 | 91 | 84 |
| Comparative Example 1 | — | — | — | 78 | 329 | 649 | 1074 | 1659 | 2208 | 2861 | 4509 | 6219 |

As apparent from Table 1, in Comparative Example 1 in which no adhesion removal step was performed but only the passivation step was repeatedly performed, as the number of times of the passivation step increased, or as the number of produced samples 20 each having a passivation film increased, the number of particles adhering onto the sample 20 increased. On the 30th sample, the number was 1,000 particles/m2 or more, and on the 100th sample, the number was 6,000 particles/m2 or more.

In contrast, in Examples 1 to 7 in which, after the passivation step, the adhesion removal step was performed, the number of particles adhering onto the sample 20 was small. Even after the 100th passivation step, the number in Example 1 was 100 particles/m2 or less, the number in Example 2 was 300 particles/m2 or less, and the numbers were 1,000 particles/m2 or less even in other examples.

The above result has revealed that by performing the adhesion removal step, the passivation step can be repeatedly performed without disassembly of the chamber while the number of adhering particles is maintained at a low level.

REFERENCE SIGNS LIST 1 film formation apparatus
10 chamber
11 stage
12 passivation gas supply pipe
13 cleaning gas supply pipe
14 inert gas supply pipe
15 discharge pipe
20 sample

The invention claimed is:

1. A film-forming method comprising:
a passivation step of supplying a passivation gas containing a sulfur-containing compound gas to a chamber in which a substrate is stored and reacting the substrate with the passivation gas to form a passivation film on a surface of the substrate; and
an adhesion removal step of removing a sulfur-containing adhesion adhering onto at least one of an inner surface of the chamber and an inner surface of a pipe connected to the chamber after the passivation step, wherein
the adhesion removal step comprises reacting the sulfur-containing adhesion with a cleaning gas containing an oxygen-containing compound gas, wherein the cleaning gas contains neither a sulfur-containing compound nor a halogen-containing compound.

2. The film-forming method according to claim 1, wherein the sulfur-containing compound gas is hydrogen sulfide gas.

3. The film-forming method according to claim 1, wherein the cleaning gas is brought into contact with the adhesion in a condition of a temperature of 20° C. or more and 800° C. or less and a pressure of 20 Pa or more and 101 kPa or less.

4. The film-forming method according to claim 1, wherein the oxygen-containing compound gas is at least one selected from the group consisting of oxygen gas, nitrogen monoxide, nitrous oxide, and carbon monoxide.

5. The film-forming method according to claim 1, wherein the oxygen-containing compound gas is oxygen gas.

6. An adhesion removal method comprising:
reacting a sulfur-containing adhesion with a cleaning gas containing an oxygen-containing compound gas, the sulfur-containing adhesion adhering onto at least one of an inner surface of a chamber and an inner surface of a pipe connected to the chamber, thereby removing the sulfur-containing adhesion,
wherein the cleaning gas contains neither a sulfur-containing compound nor a halogen-containing compound.

7. The adhesion removal method according to claim 6, wherein the oxygen-containing compound gas is at least one selected from the group consisting of oxygen, nitrogen monoxide, nitrous oxide, and carbon monoxide.

8. The adhesion removal method according to claim 6, wherein the oxygen-containing compound gas is oxygen gas.

9. The adhesion removal method according to claim 6, wherein the cleaning gas is brought into contact with the adhesion in a condition of a temperature of 20° C. or more and 800° C. or less and a pressure of 20 Pa or more and 101 kPa or less.

10. The adhesion removal method according to claim 9, wherein the oxygen-containing compound gas is at least one selected from the group consisting of oxygen gas, nitrogen monoxide, nitrous oxide, and carbon monoxide.

11. The adhesion removal method according to claim 9, wherein the oxygen-containing compound gas is oxygen gas.

* * * * *